United States Patent
Wang

(10) Patent No.: US 7,889,583 B2
(45) Date of Patent: *Feb. 15, 2011

(54) MEMORY CIRCUIT AND TRACKING CIRCUIT THEREOF

(75) Inventor: Chia Wei Wang, Fongyuan (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/841,804

(22) Filed: Jul. 22, 2010

(65) Prior Publication Data

US 2010/0284232 A1 Nov. 11, 2010

Related U.S. Application Data

(63) Continuation-in-part of application No. 12/266,593, filed on Nov. 7, 2008, now Pat. No. 7,787,317.

(51) Int. Cl.
*G11C 29/00* (2006.01)
(52) U.S. Cl. .................................. 365/200; 365/230.06
(58) Field of Classification Search ................ 365/194, 365/230.06, 210.1, 189.08
See application file for complete search history.

(56) References Cited

U.S. PATENT DOCUMENTS

| | | | |
|---|---|---|---|
| 6,738,296 B2 | 5/2004 | Sung et al. | |
| 6,754,131 B2 | 6/2004 | Kirsch et al. | |
| 6,996,019 B2 | 2/2006 | Song | |
| 6,996,020 B2 | 2/2006 | Yoshida | |
| 2010/0118628 A1* | 5/2010 | Wang | 365/194 |

* cited by examiner

*Primary Examiner*—Richard Elms
*Assistant Examiner*—Hien N Nguyen
(74) *Attorney, Agent, or Firm*—Thomas, Kayden, Horstemeyer & Risley

(57) ABSTRACT

A tracking circuit of a memory circuit is provided. The tracking circuit is coupled between a control circuit and a sense amplifier, delays a word-line pulse signal generated by the control circuit by a delay period to generate a sense amplifier enable signal enabling the sense amplifier to detect data bits output by a memory cell array. In one embodiment, the tracking circuit comprises a plurality of dummy cells and a dummy bit line. At least one of the plurality of dummy cells comprises a plurality of cascaded transistors cascaded between the dummy bit line and a ground voltage for lowering down a dummy bit line signal on the dummy bit line when the word-line pulse signal is enabled. The dummy bit line is coupled to the dummy cells and carries the dummy bit line signal.

21 Claims, 12 Drawing Sheets

MEMORY CIRCUIT AND TRACKING CIRCUIT THEREOF

CROSS REFERENCE TO RELATED APPLICATIONS

This application is a Continuation-In-Part of U.S. patent application Ser. No. 12/266,593, filed Nov. 7, 2008 and entitled "Memory circuit and tracking circuit thereof," now U.S. Pat. No. 7,787,317.

BACKGROUND OF THE INVENTION

1. Field of the Invention

The invention relates to memory circuits, and more particularly to memory circuits with sense amplifiers.

2. Description of the Related Art

A memory circuit comprises a memory cell array storing a plurality of data bits.

When a memory circuit is read, a control circuit of the memory circuit enables a word line coupled to the memory cell array, and the memory cell array triggered by the word line outputs read data bits to a bit line. The memory cell array, however, has a weak driving ability for driving an output voltage of the memory circuit. Thus, a sense amplifier is used to detect the read data bits on the bit line and generates an output signal according to the read data bits.

Referring to FIG. 1, a schematic diagram of voltage changes of a word line WL, a bit line BL, and a sense amplifier enable signal SAE of a memory circuit is shown. A control circuit first raises the voltage of the word line WL to a high level at time $t_0$ to initiate reading of a memory cell array. The memory cell array then outputs data bits to the bit line BL. When the read data bit is "1", the voltage of the bit line BL is maintained at a high level 102. When the read data bits is "0", the memory cell array lowers the voltage of the bit line BL to a low level, as shown by the mark 104. The difference M between the high level 102 and the lowered level is referred to as a read margin.

If the delay time $T_D$ between time $t_0$ and time $t_1$ is not long enough, the read margin M may be smaller than the resolution of the sense amplifier, then the sense amplifier will mistakenly recognize the output data bit "0" as a data bit "1", thus inducing reading errors of the memory circuit. When the delay time $T_D$ is extended to increase the read margin M to ensure correctness of data detection of the sense amplifier, access time of the memory circuit is increased. Thus, the delay time and the read margin must be properly determined.

Referring to FIG. 2, a circuit diagram of a sense amplifier 220 of a memory circuit is shown. The sense amplifier 220 comprises two PMOS transistors 228 and 230 and three NMOS transistors 222, 224, and 226. Before a word line is enabled, a pre-charge signal PRE turns on the transistors 202 and 204 to charge voltages of the nodes 206 and 208 to a high voltage $V_{DD}$. The word line is then enabled to trigger a memory cell array to output data to a bit line BL and a bit line bar BLB. A signal pgB then turns on the transistors 212 and 214 to input the data on the bit line BL and the bit line bar BLB to the nodes 206 and 208. A sense amplifier enable signal SAE is then enabled to turn on the NMOS transistor 226, thus enabling the sense amplifier 220 to detect the data bits on the nodes 206 and 208.

Referring to FIG. 3A, probability distributions of an offset voltage of a sense amplifier and a voltage of a bit line affected by a memory cell current under a higher voltage supply level of 1.2V are shown. The probability distribution of the offset voltage of the sense amplifier is shown with a solid line, and the probability distribution of the voltage of the bit line affected by the memory cell current is shown with a dotted line. An overlapping portion of the two probability distributions induces reading errors of the sense amplifier. The overlapping section of the two probability distributions means that a cell current of a memory cell array has generated a bit line voltage that cannot be detected by a sense amplifier, thus inducing reading errors of the sense amplifier. In other words, a probability of occurrence of reading errors is equal to a convolution of the two probability distribution functions shown in FIG. 3A.

When a voltage level of a voltage source $V_{DD}$ supplied to a memory circuit is lowered, a cell current generated by memory cells of the memory circuit has a reduced level, thus decreasing a read margin of a bit line and negatively affecting correctness of output data generated by a sense amplifier. Referring to FIG. 3B, probability distributions of an offset voltage of a sense amplifier and a voltage of a bit line affected by a memory cell current under a lower voltage supply level of 0.72V are shown. The overlapped section of the two probability distributions shown in FIG. 3B is enlarged in comparison with that shown in FIG. 3A. Because a probability of occurrence of reading errors is equal to a convolution of the two probability distribution functions, the probability of occurrence of reading errors is increased in FIG. 3B due to lowering of the supplied voltage level. Thus, when a voltage level of a voltage source supplied to a memory circuit is lowered, the sense amplifier may detect data bits with errors, thus generating an erroneous output signal.

Referring to FIG. 4, a block diagram of a conventional tracking circuit 400 generating a sense amplifier enable signal SAE is shown. The tracking circuit 400 is made up of logical gates and comprises a plurality of inverters 402, 404, and 406 and an AND gate 408. The inverters 402, 404, and 406 sequentially invert the voltage of the word line WL. Each of the inverters 402, 404, and 406 delays the signal on the word line WL for a short period. The AND gate 408 then performs an AND operation on the voltage of the word line and the inverted voltage output by the inverter 406 to obtain the sense amplifier enable signal SAE.

An operating voltage of a memory circuit may change in response to different host system applications. When a host system application has a heavy data processing load, a voltage level of a voltage source supplied to the memory circuit may be increased for better performance. When application of the host system has a light data processing load, a voltage level of the voltage source supplied to the memory circuit may be decreased to reduce power consumption. When the voltage level of the voltage source is decreased, because a memory cell array comprises a plurality of cells made up of transistors, the cell currents are reduced due to the decreased voltage level of the voltage source, and the memory cell array has a poorer ability for driving the voltage on the bit line. Thus, a tracking circuit should delay a voltage of a word line for a longer period to generate a sense amplifier enable signal SAE when a supply voltage level is decreased, thus allowing the memory cell array to have a longer time period to discharge the bit line. The tracking circuit 400, however, is made up of logical gates and does not adjust the delay period $T_D$ according to different supply voltage levels. Thus, a sense amplifier triggered by a sense amplifier enable signal SAE generated by the conventional tracking circuit 400 generates an output signal with poor accuracy when a voltage level of the voltage source supplied to the memory circuit is decreased.

Referring to FIG. 5A, a block diagram of another conventional tracking circuit 500 generating a sense amplifier enable signal SAE is shown. The tracking circuit 500 comprises a plurality of dummy cells 502~510 and an inverter 520. Each of the dummy cells has a similar structure as the dummy cell 550 shown in FIG. 5B. The dummy cell 550 comprises two inverters 556 and 558 and two NMOS transistors 552 and 554 with high threshold voltage $V_T$ and stores a data bit "0". The node 562 therefore has a logic low voltage and the node 564 has a logic high voltage. When the word line WL is enabled, the NMOS transistors 552 and 554 are turned on, coupling the node 562 to a dummy bit line DMY_BL and coupling the node 564 to a dummy bit line bar DMY_BLB. Thus, the voltage of the dummy bit line DMY_BL shown in FIG. 5A is gradually lowered to the logic low level by the dummy cells 502~510 when the word line WL is enabled. The inverter 520 then inverts the voltage of the dummy bit line DMY_BL to obtain the sense amplifier enable signal SAE, which has a delay in comparison with the voltage of the word line due to the weak voltage driving ability of the dummy cells 502~510.

The plurality of dummy cells 502~510 are made up of transistors with a high threshold voltage. However, the logic cells in the following delay path, such as the inverter 520, are made up of transistors with a standard threshold voltage. Because a current I flowing through a transistor is in proportion to $(V_{DD}-V_T)^2$, wherein $V_{DD}$ is the supplied voltage and $V_T$ is the threshold voltage of the transistor, when the supplied voltage $V_{DD}$ is lowered, the current I flowing through a transistor with a high threshold voltage is reduced by a greater amount than a transistor with a standard threshold voltage, thus inducing a greater signal delay. In other words, even though the dummy cells 502~510 are made up of transistors with a high threshold voltage, when a voltage level of a voltage source supplied to the tracking circuit 500 and the memory cell array is lowered, a delay mismatch between the tracking circuit 500 and the memory cell array would be induced due to the existence of devices with a standard threshold voltage, and performance of the whole memory circuit is degraded. Thus, a tracking circuit of a memory circuit without the aforementioned deficiencies is required.

BRIEF SUMMARY OF THE INVENTION

The invention provides a memory circuit. In one embodiment, the memory circuit comprises a control circuit, a word-line driver, a tracking circuit, and a sense amplifier. The control circuit enables a word-line pulse signal to initiate reading of a memory cell array. The word-line driver enables a word-line according to the word-line pulse signal to trigger the memory cell array to output data bits stored therein to a bit line. The tracking circuit delays the word-line pulse signal by a delay period to generate a sense amplifier enable signal. The sense amplifier detects the data bits on the bit line to generate an output signal when the sense amplifier enable signal is enabled. The tracking circuit comprises a plurality of dummy cells and a dummy bit line coupled to the dummy cells, the dummy bit line carrying a dummy bit line signal, at least one of the dummy cells comprises a plurality of cascaded transistors cascaded between the dummy bit line and a ground voltage for lowering the dummy bit line signal on the dummy bit line when the word-line pulse signal is enabled.

The invention provides a tracking circuit of a memory circuit. The tracking circuit is coupled between a control circuit and a sense amplifier, delays a word-line pulse signal generated by the control circuit by a delay period to generate a sense amplifier enable signal enabling the sense amplifier to detect data bits output by a memory cell array. In one embodiment, the tracking circuit comprises a plurality of dummy cells and a dummy bit line. At least one of the plurality of dummy cells comprises a plurality of cascaded transistors cascaded between the dummy bit line and a ground voltage for lowering a dummy bit line signal on the dummy bit line when the word-line pulse signal is enabled. The dummy bit line is coupled to the dummy cells and carries the dummy bit line signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 6:
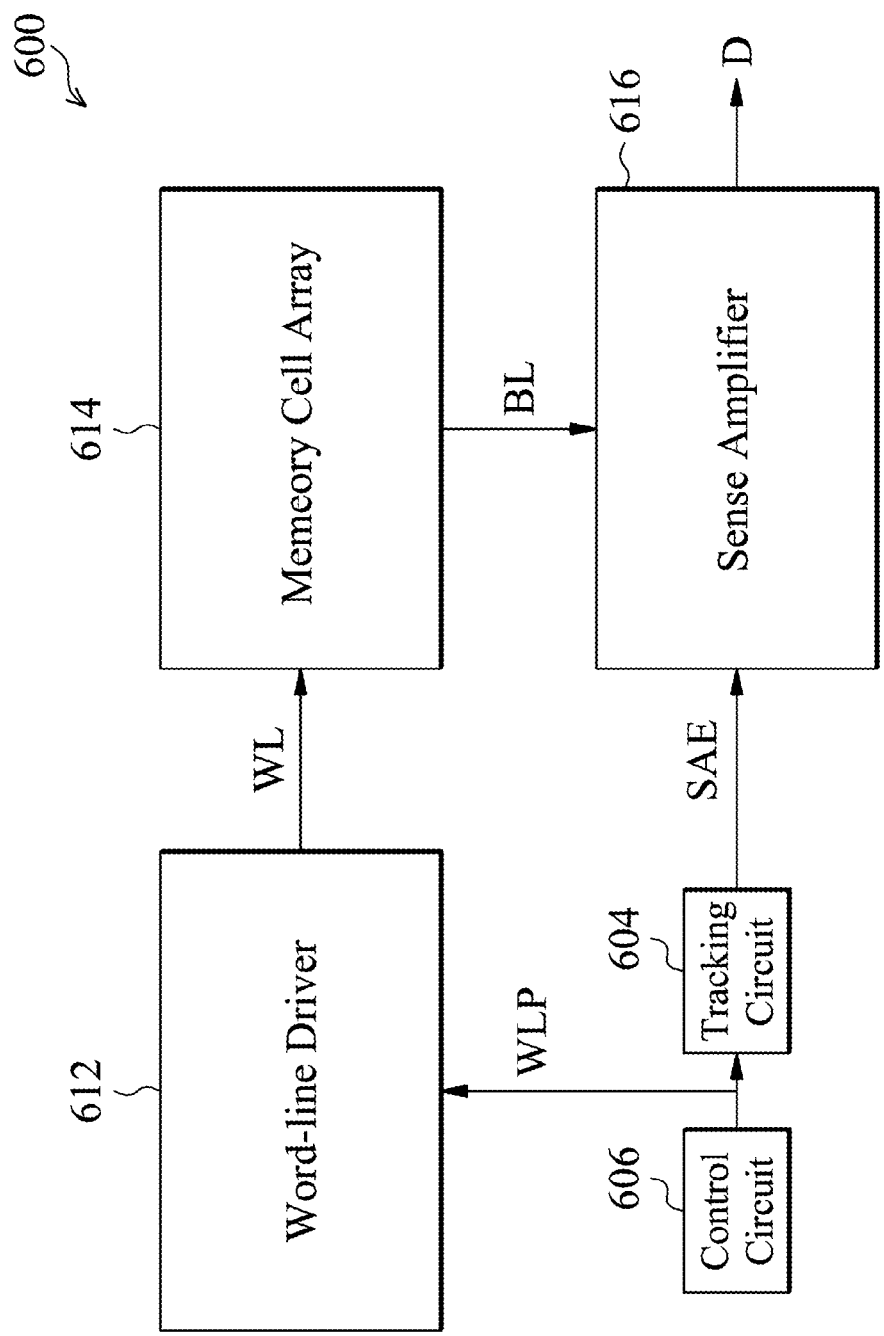
FIG. 6 is a block diagram of a memory circuit according to the invention.

In this invention, the dummy cells may be designed to compensate the mismatch resulting from the logic cells including transistors with a standard threshold voltage. The dummy cells may be made up of devices with high or standard threshold voltages. Referring to FIG. 6, a block diagram of a memory circuit 600 according to the invention is shown. The memory circuit 600 comprises a control circuit 606, a tracking circuit 604, a word-line driver 612, a memory cell array 614, and a sense amplifier 616. The control circuit 606 generates a word line pulse signal WLP to initiate a data read operation. The word line pulse signal WLP is then delivered to the word-line driver 612 and the tracking circuit 604. The word line driver 612 then enables a word line WL according to the word line pulse signal WLP. The memory cell array 614 then reads a data bit from a memory cell anticipated by the enabled word line WL and outputs the read data bit to the bit line BL.

When the tracking circuit 604 receives the word line pulse signal WLP generated by the control circuit 606, the tracking circuit 604 delays the word line pulse signal WLP by a delay period to generate a sense amplifier enable signal SAE. The sense amplifier enable signal SAE then triggers the sense amplifier 616 to detect the voltage of the bit line BL to determine a value of the read data bit. The sense amplifier 616 then generates an output signal indicating the value of the read data bit as an output of the memory circuit 600. In addition, when a voltage level of a voltage source supplied to the memory circuit 600 is lowered, a cell current level generated by transistors of memory cells of the memory cell array 614 is also lowered, requiring a greater time period for discharging the bit line BL. The tracking circuit 604 automatically extends the delay period for delaying the word line pulse signal, thus generating the sense amplifier enable signal SAE with a longer delay to allow the memory cell array 614 a greater time period for discharging. Thus, improving of the accuracy of the data bit value determined by the sense amplifier 616.

Figure 7:
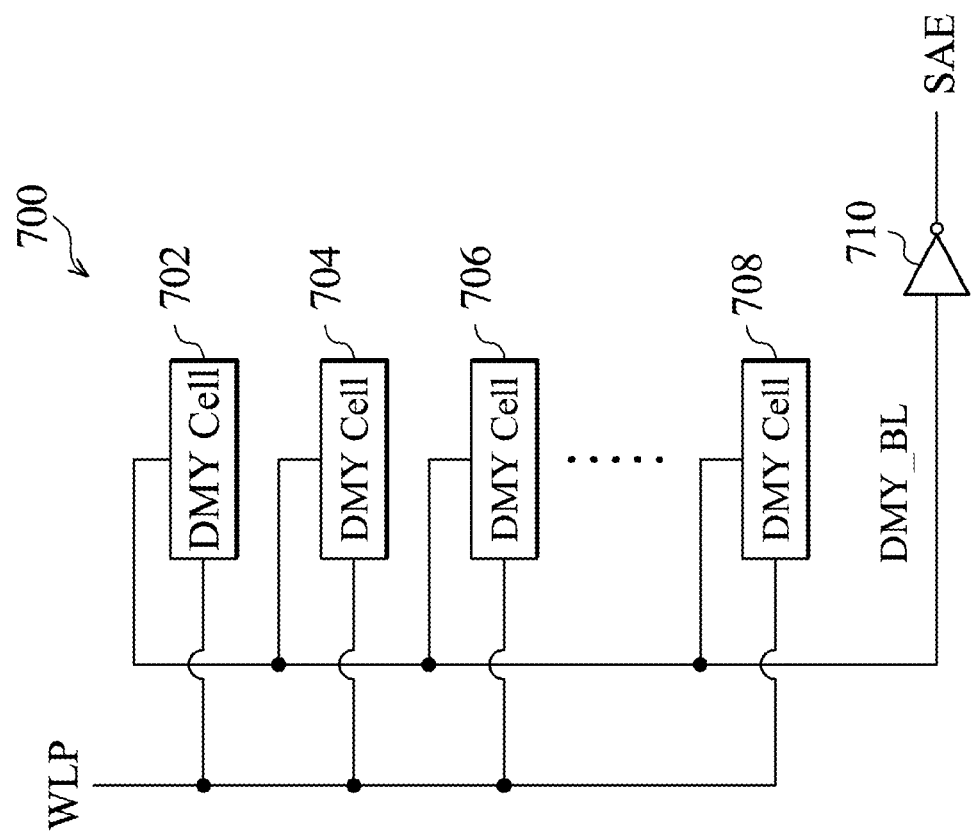
FIG. 7 is a block diagram of a tracking circuit according to the invention.

Referring to FIG. 7, a block diagram of a tracking circuit 700 according to the invention is shown. The tracking circuit 700 comprises a plurality of dummy cells 702~708, a dummy bit line DMY_BL, and an inverter 710. The dummy cells 702~708 are controlled by a word line pulse WLP. When the word line pulse signal WLP is enabled, the dummy cells 702~708 pull down the voltage of the dummy bit line DMY_BL to ground. The inverter 710 then inverts the voltage of the dummy bit line DMY_BL to obtain a sense amplifier enable signal SAE for enabling a sense amplifier. Because the dummy cells gradually lowers the voltage of the dummy bit line DMY_BL, the voltage of the dummy bit line DMY_BL is lowered with a delay, and the sense amplifier enable signal SAE is enabled with a delay in comparison with the word line pulse signal WLP.

Figure 8B:
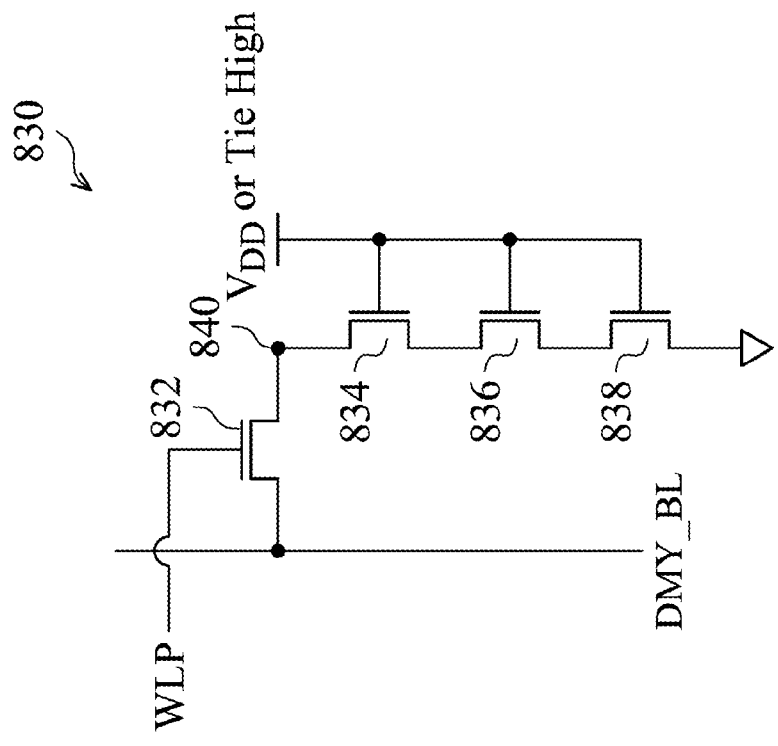
FIGS. 8A, 8B, and 8C are circuit diagrams of embodiments of a dummy cell according to the invention.
Figure 8A:
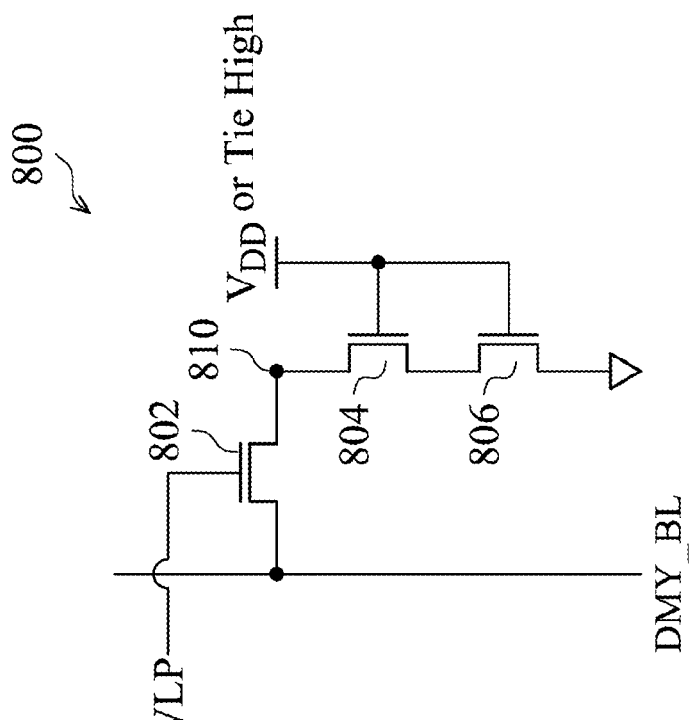

Referring to FIG. 8A, a circuit diagram of a first embodiment of a dummy cell 800 according to the invention is shown. The dummy cell 800 comprises three NMOS transistors 802, 804, and 806. The NMOS transistor 802 is coupled between a node 810 and a dummy bit line DMY_BL. The gate of the NMOS transistor 802 is coupled to a word line pulse signal WLP. The NMOS transistors 804 and 806 are cascaded between the node 810 and a ground. The gates of the NMOS transistors 804 and 806 are coupled to a voltage source $V_{DD}$ or pulled to a high voltage. When the word line pulse signal WLP is enabled, the NMOS transistor 802 is turned on to couple the node 810 to the dummy bit line DMY_BL. The voltage of the dummy bit line DMY_BL is therefore gradually pulled down to the ground voltage.

In addition, because the NMOS transistors 804 and 806 are cascaded over the ground voltage, the NMOS transistor 804 has a high threshold voltage due to body effects. When the voltage level of the voltage source $V_{DD}$ is lowered, the current flowing through the NMOS transistor 804 is lowered by a great level with lowering of the supplied voltage level $V_{DD}$ due to the high threshold voltage. The dummy bit line DMY_BL therefore requires a greater time to be discharged by a read margin, and the sense amplifier enable signal SAE has a greater delay for triggering a sense amplifier 616. Thus, a memory cell array 614 with a lowered cell current level due to lowering of the supplied voltage level $V_{DD}$ is allowed a greater time period for discharging a bit line BL, improving accuracy of the determination of the read bit value of the sense amplifier 616.

Referring to FIG. 8B, a circuit diagram of a second embodiment of a dummy cell 830 according to the invention is shown. The dummy cell 830 comprises four NMOS transistors 832, 834, 836, and 838. The NMOS transistor 832 is coupled between a node 840 and a dummy bit line DMY_BL. The gate of the NMOS transistor 832 is coupled to a word line pulse signal WLP. The NMOS transistors 834, 836, and 838 are cascaded between the node 840 and a ground. The gates of the NMOS transistors 834, 836, and 838 are coupled to a voltage source $V_{DD}$ or pulled to a high voltage. When the word line pulse signal WLP is enabled, the NMOS transistor 832 is turned on to couple the node 840 to the dummy bit line DMY_BL. The voltage of the dummy bit line DMY_BL is therefore gradually pulled down to the ground voltage. In addition, the NMOS transistor 834 has a higher threshold voltage than that of the NMOS transistor 804 due to body effects, and a tracking circuit comprising dummy cells with the same structure as the dummy cell 830 has a greater delay when a supplied voltage level $V_{DD}$ is lowered.

Figure 8C:
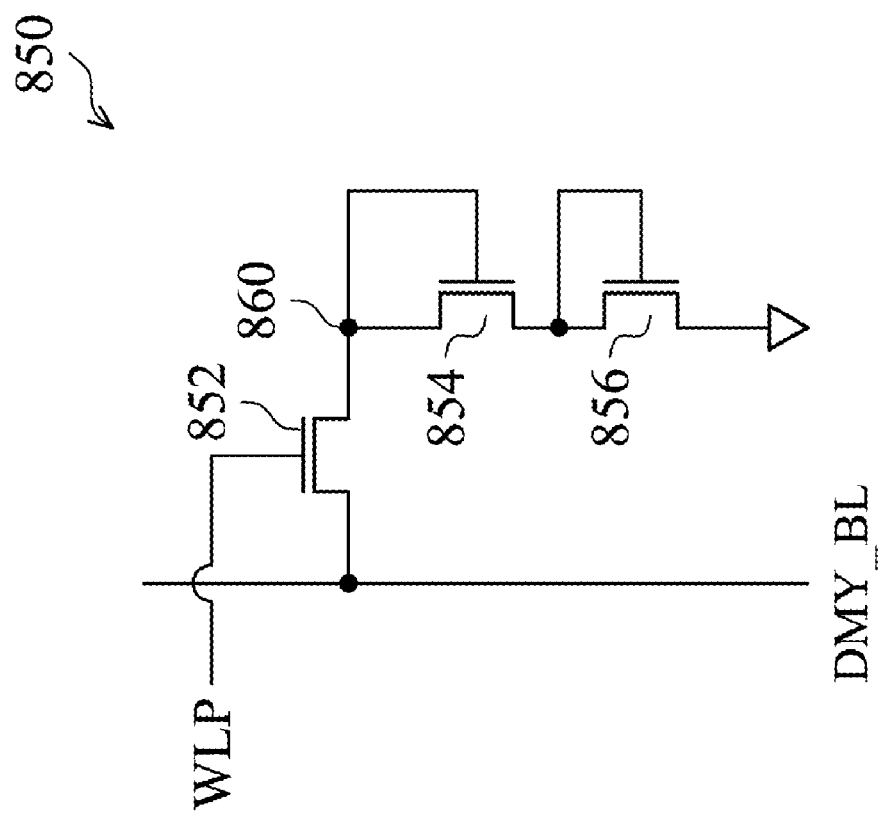

Referring to FIG. 8C, a circuit diagram of a third embodiment of a dummy cell 850 according to the invention is shown. The dummy cell 850 comprises three NMOS transistors 852, 854, and 856. The NMOS transistor 852 is coupled between a node 860 and a dummy bit line DMY_BL. The gate of the NMOS transistor 852 is coupled to a word line pulse signal WLP. The NMOS transistors 854 and 856 are cascaded between the node 860 and a ground. The gates of the NMOS transistors 854 and 856 are coupled to the drains thereof, thus obtaining the two transistors in diode connection. When the word line pulse signal WLP is enabled, the NMOS transistor 852 is turned on to couple the node 860 to the dummy bit line DMY_BL. The voltage of the dummy bit line DMY_BL is therefore gradually pulled down to the ground voltage.

Figure 1:
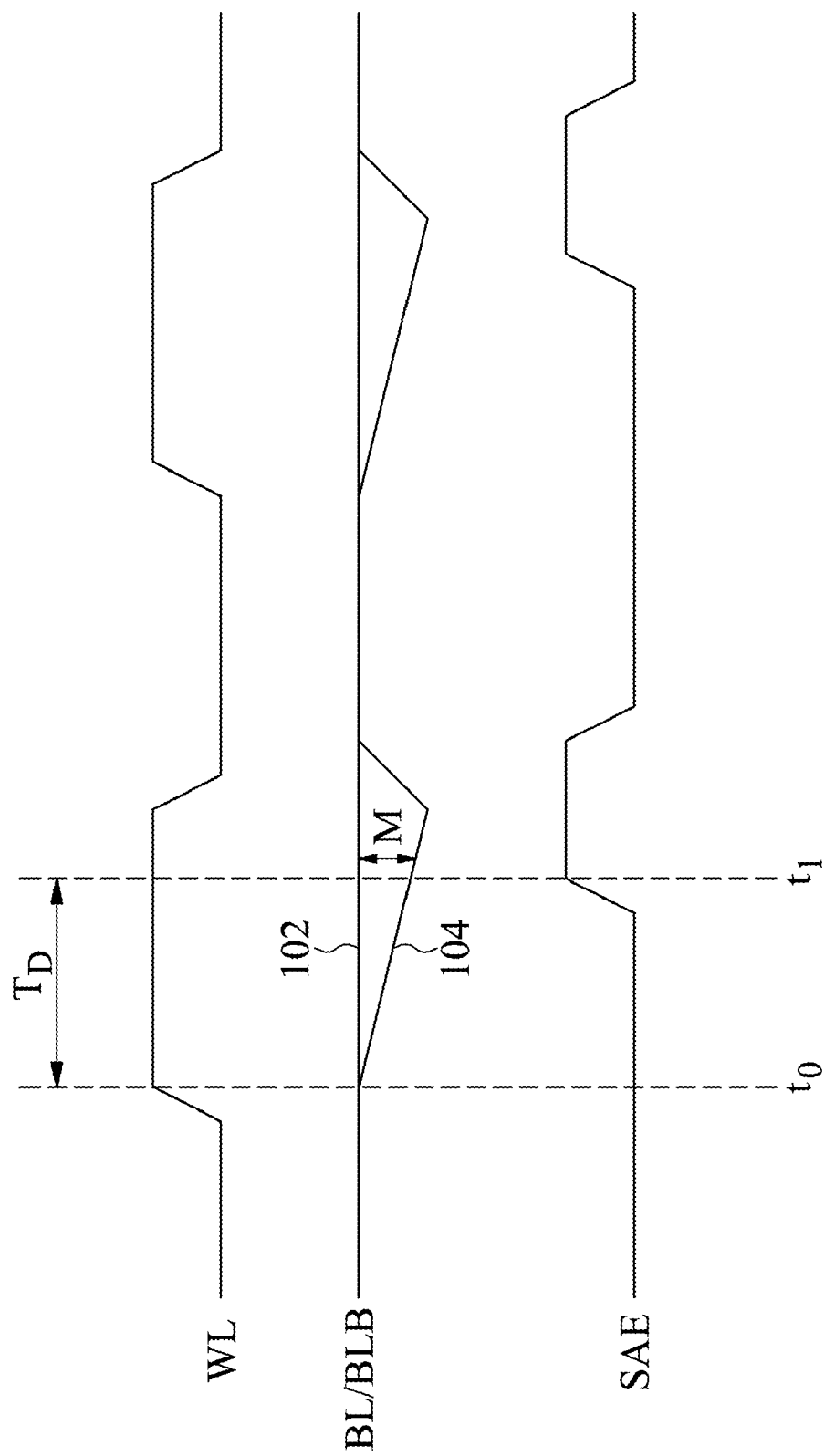
FIG. 1 is a schematic diagram of voltage changes of a word line, a bit line, and a sense amplifier enable signal of a memory circuit.
Figure 2:
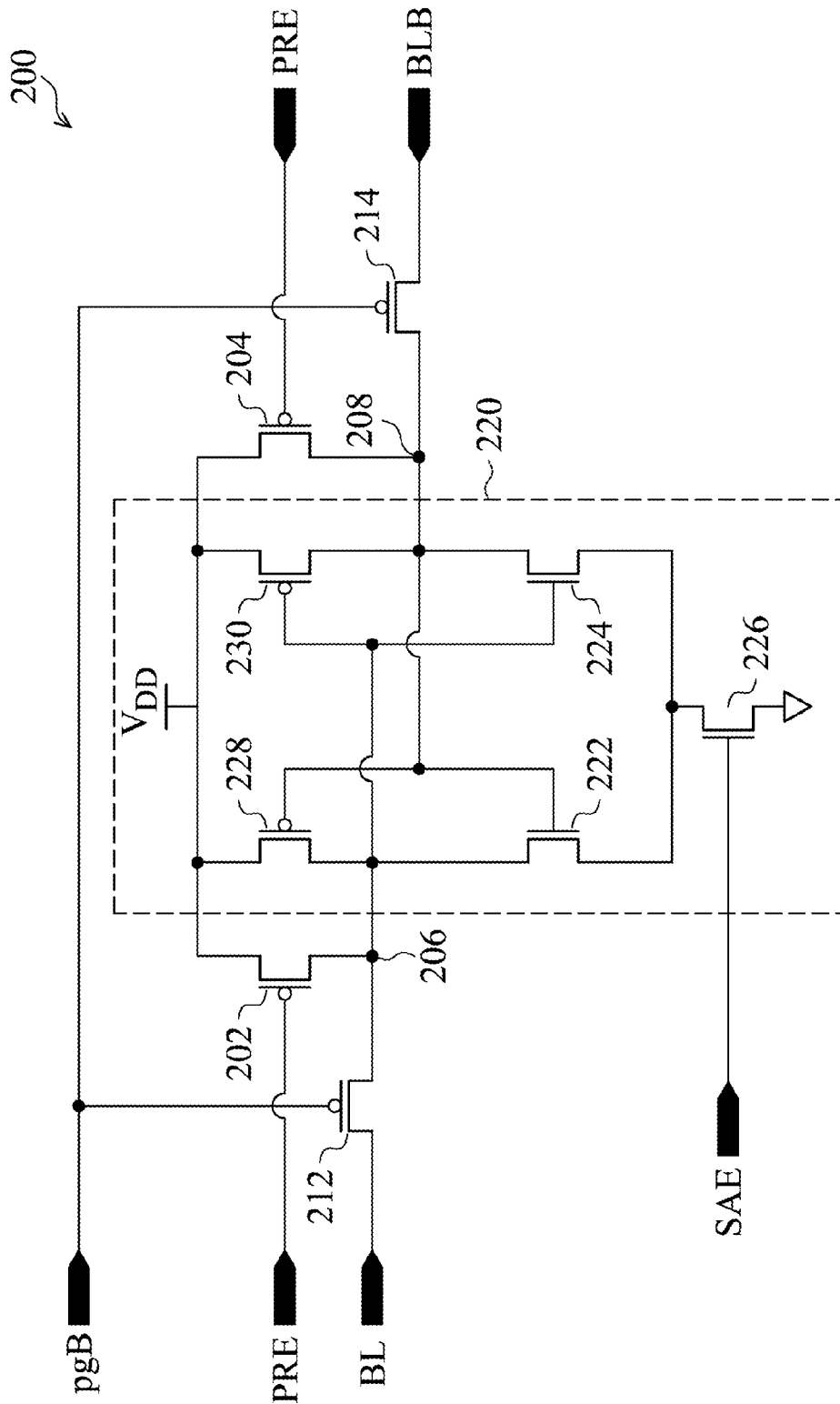
FIG. 2 is a circuit diagram of a sense amplifier of a memory circuit.
Figure 3A:
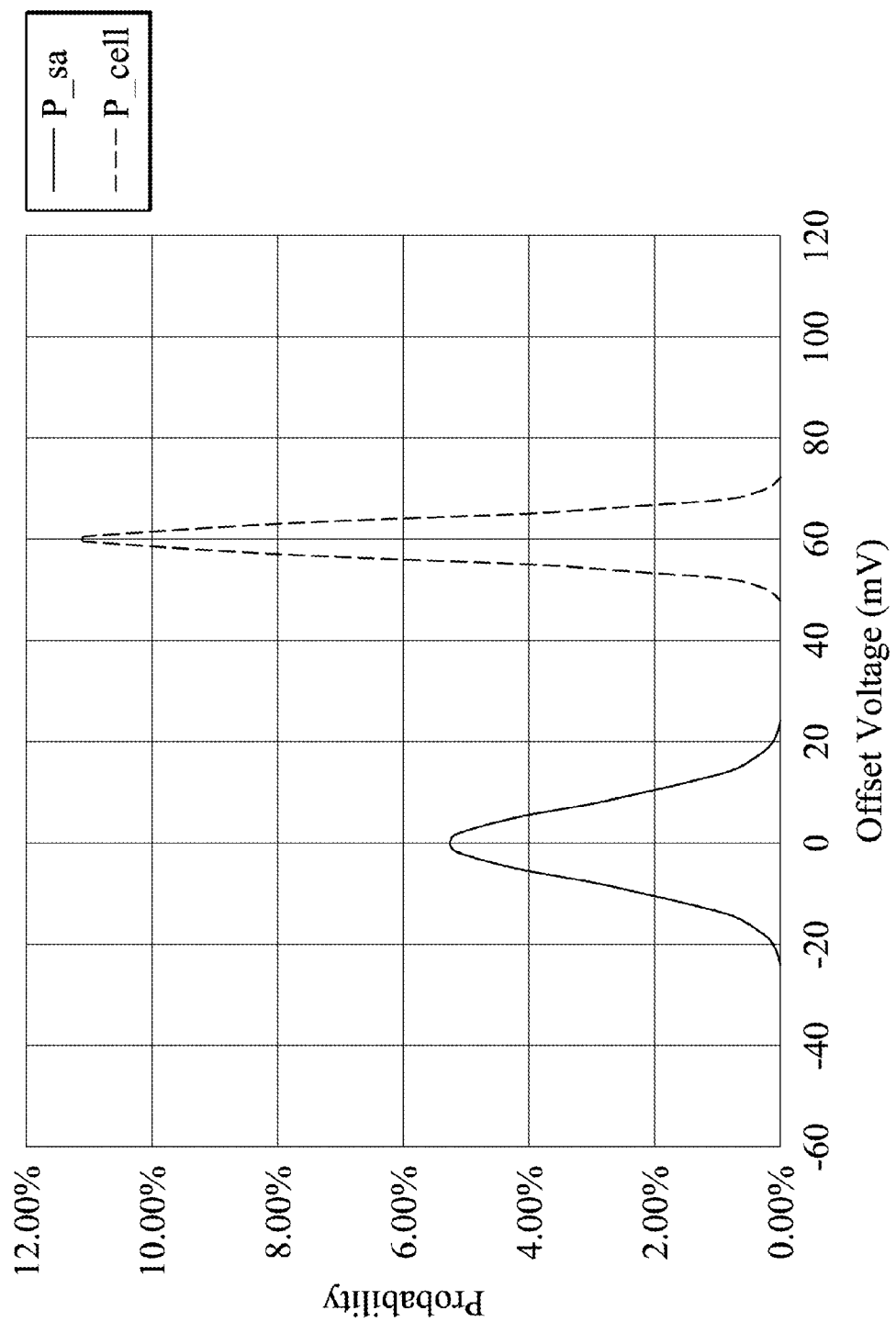
FIG. 3A shows probability distributions of an offset voltage of a sense amplifier and a voltage of a bit line affected by a memory cell current under a higher voltage supply level of 1.2V.
Figure 3B:
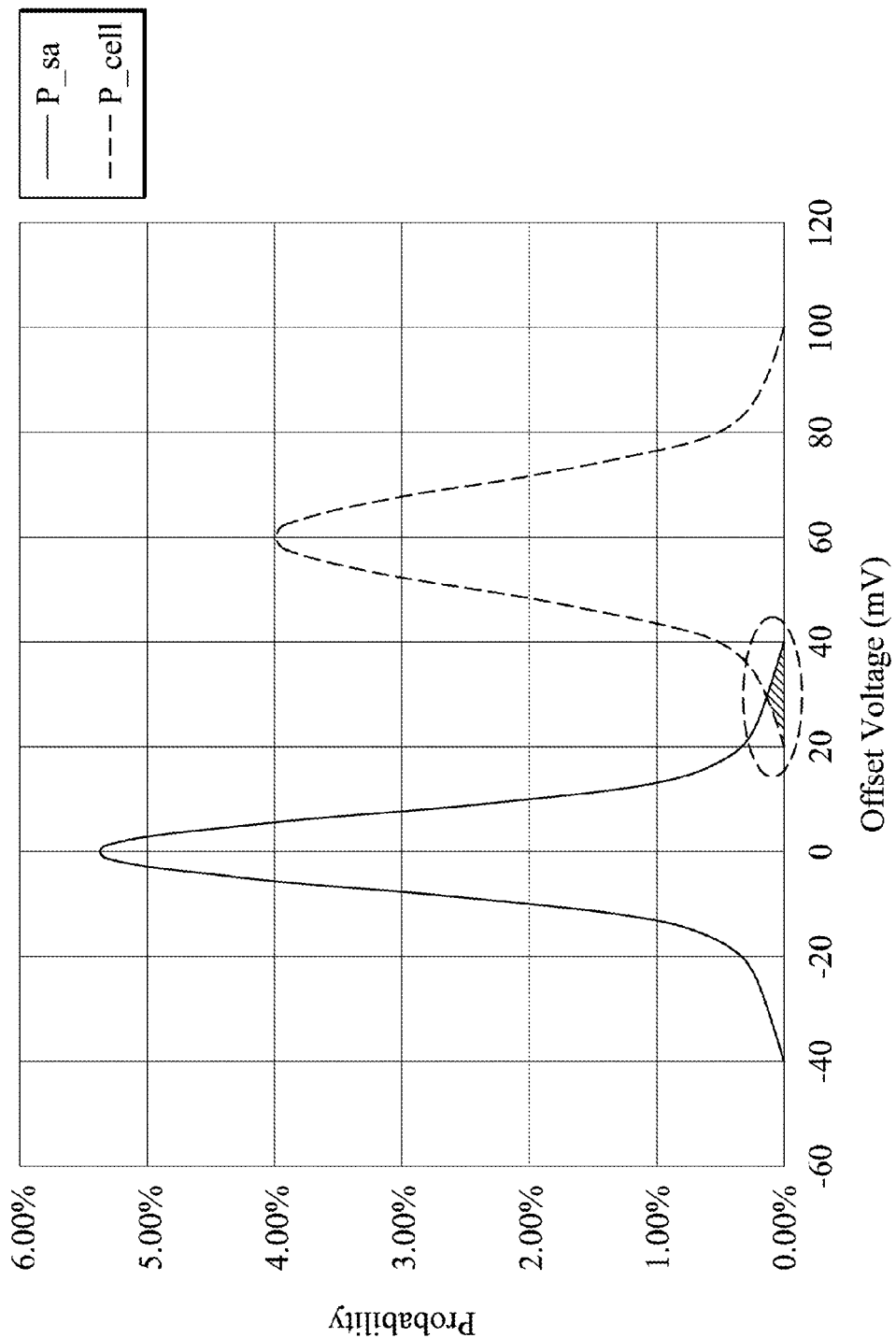
FIG. 3B shows probability distributions of an offset voltage of a sense amplifier and a voltage of a bit line affected by a memory cell current under a lower voltage supply level of 0.72V.
Figure 4:
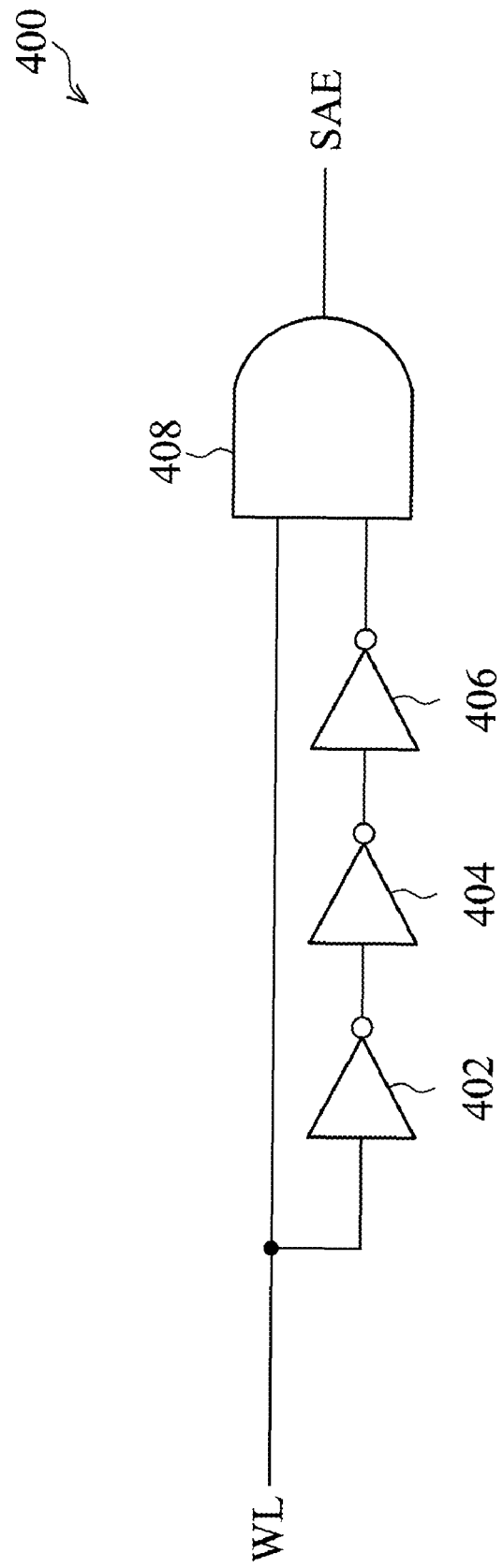
FIG. 4 is a block diagram of a conventional tracking circuit generating a sense amplifier enable signal.
Figures 5A, 5B:
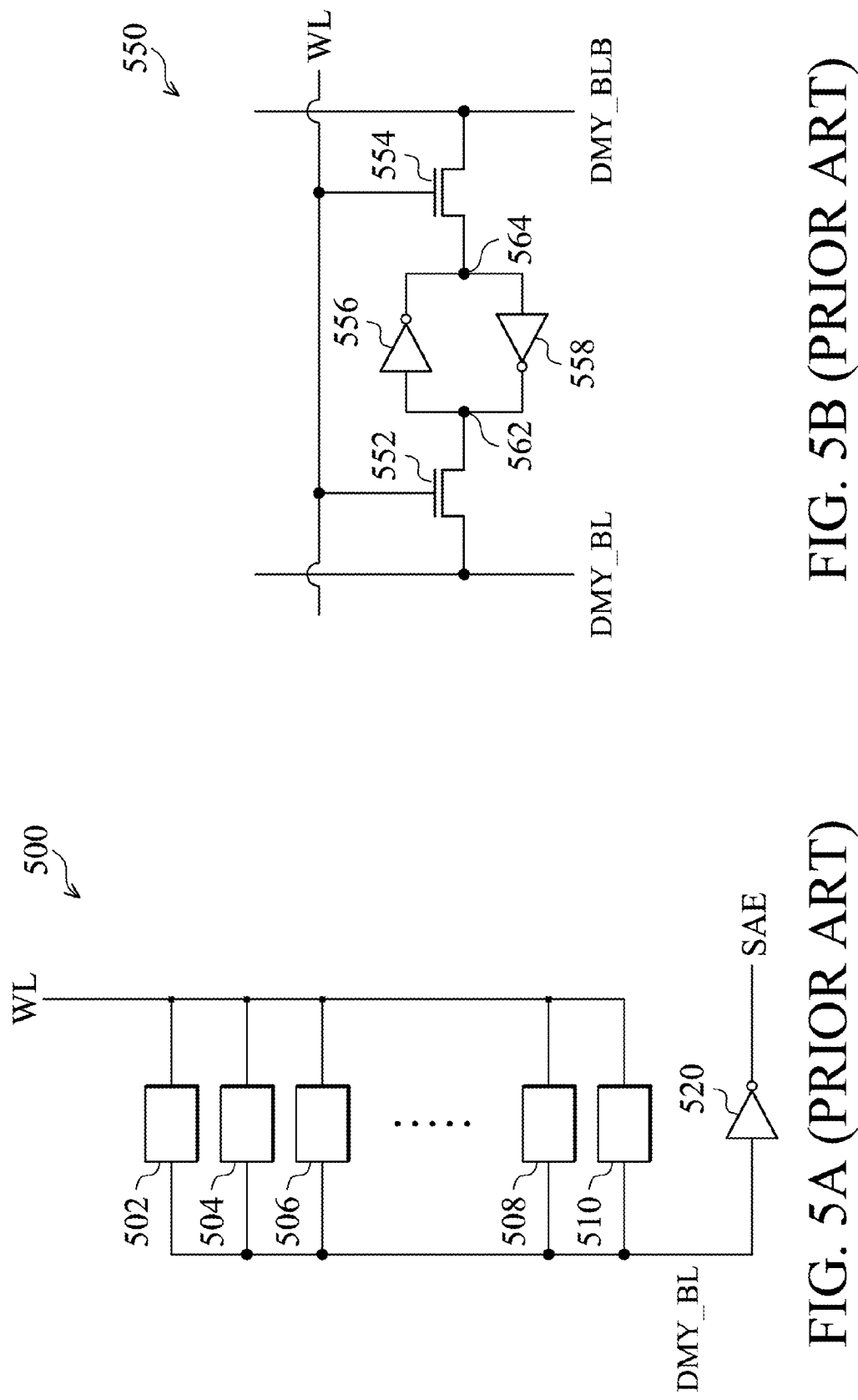
FIG. 5A is a block diagram of another conventional tracking circuit generating a sense amplifier enable signal.
FIG. 5B is a circuit diagram of a dummy cell of the tracking circuit of FIG. 5A.
Figure 9:
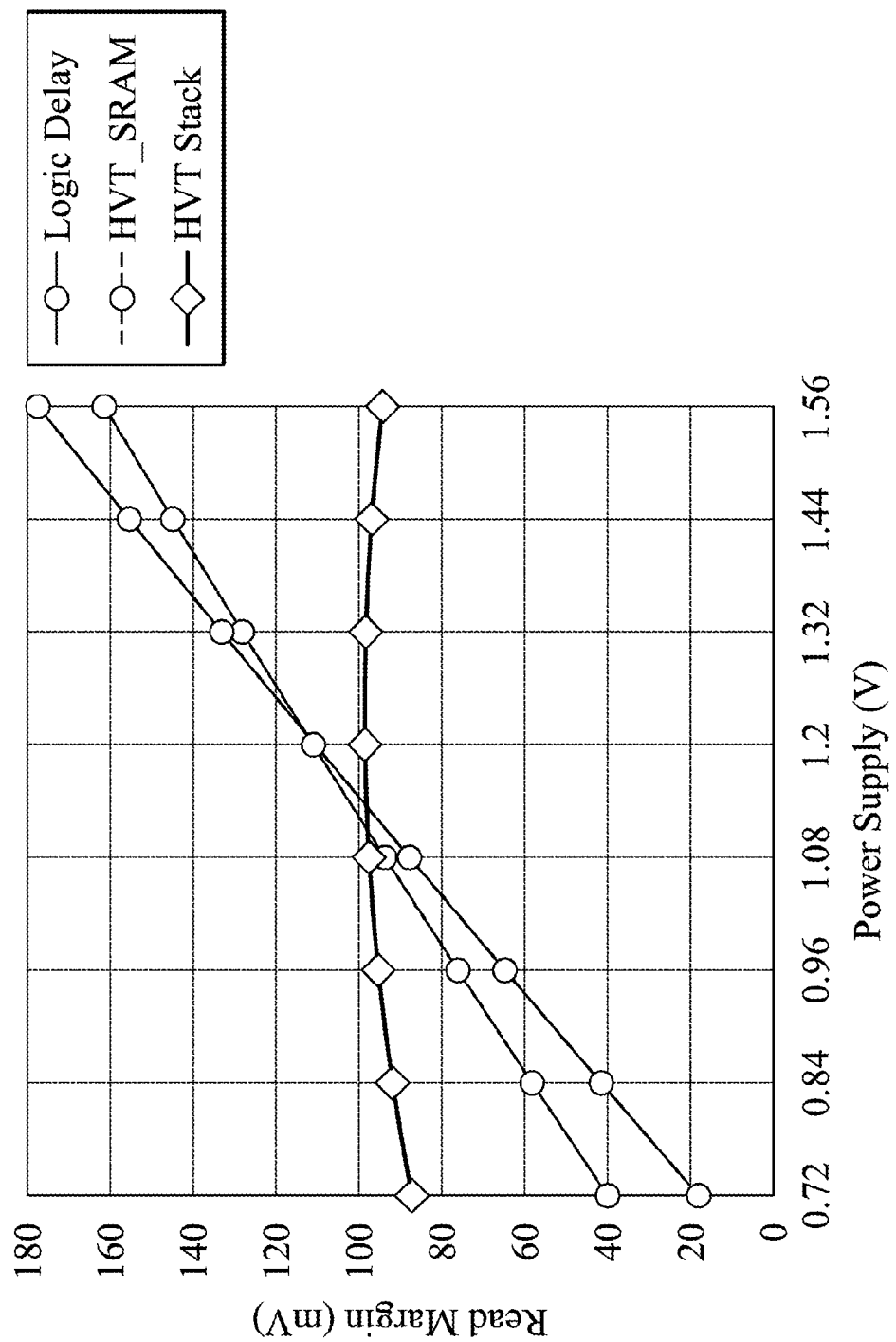
FIG. 9 is a schematic diagram of comparison of read margins of tracking circuits with similar structures as those in FIGS. 4, 5A, and 7.

Referring to FIG. 9, a schematic diagram of comparison of read margins of tracking circuits with similar structures as those in FIGS. 4, 5A, and 7 is shown. The line with the greatest slope is an experimental result of a tracking circuit 400 made up of logic gates. Because a power consumption of a memory device is proportional to a product of an operating frequency f, a bit line load capacitance C, a supplied voltage level V, and a sensing margin dV, an excessive high read margin dV causes extra power consumption of the memory device. Thus, when a level of a power supply voltage is high, the tracking circuit 400 would have an excessively long tracking delay, resulting in an unnecessarily large read margin and causing extra power consumption. When a level of a power supply voltage is low, the tracking circuit 400 would have an excessively low tracking delay, resulting in an insufficient small read margin and causing a greater probability of read error occurrence.

Compared to the tracking circuit 400, an experimental result of the tracking circuit 500 comprising dummy cells made up of high-threshold-voltage transistors has a smaller slope. However, the high-threshold-voltage transistors of the dummy cells 502~510 of the tracking circuit 500 requires extra manufacturing costs. Because the tracking circuit 700 provided by the invention comprises dummy cells having a high threshold voltage due to cascade connection, a signal delay caused by the dummy cells 702~708 of the tracking circuit 700 well compensates for a signal delay caused by the inverter 710 of the tracking circuit 700 and/or the subsequent delay path. The experimental results of the tracking circuit 700 therefore have a flat slope shown in FIG. 9, and the tracking circuit 700 therefore has a wide operating voltage range. In addition, the transistors of the dummy cells 702~708 of the tracking circuit 700 may be high-threshold-voltage or standard-threshold voltage transistors. In other words, the transistors of the dummy cells 702~708 of the tracking circuit 700 may be manufactured to have standard threshold voltages different from those of transistors of memory cells of the memory cell array 614, lowering manufacturing costs of the tracking circuit 700. Moreover, when a level of a power supply voltage is high, the tracking circuit 700 does not have such an excessively long tracking delay as the tracking circuit 400. The tracking circuit 700 therefore has an appropriate read margin and has smaller power consumption in comparison with the tracking circuit 400.

Figure 10:
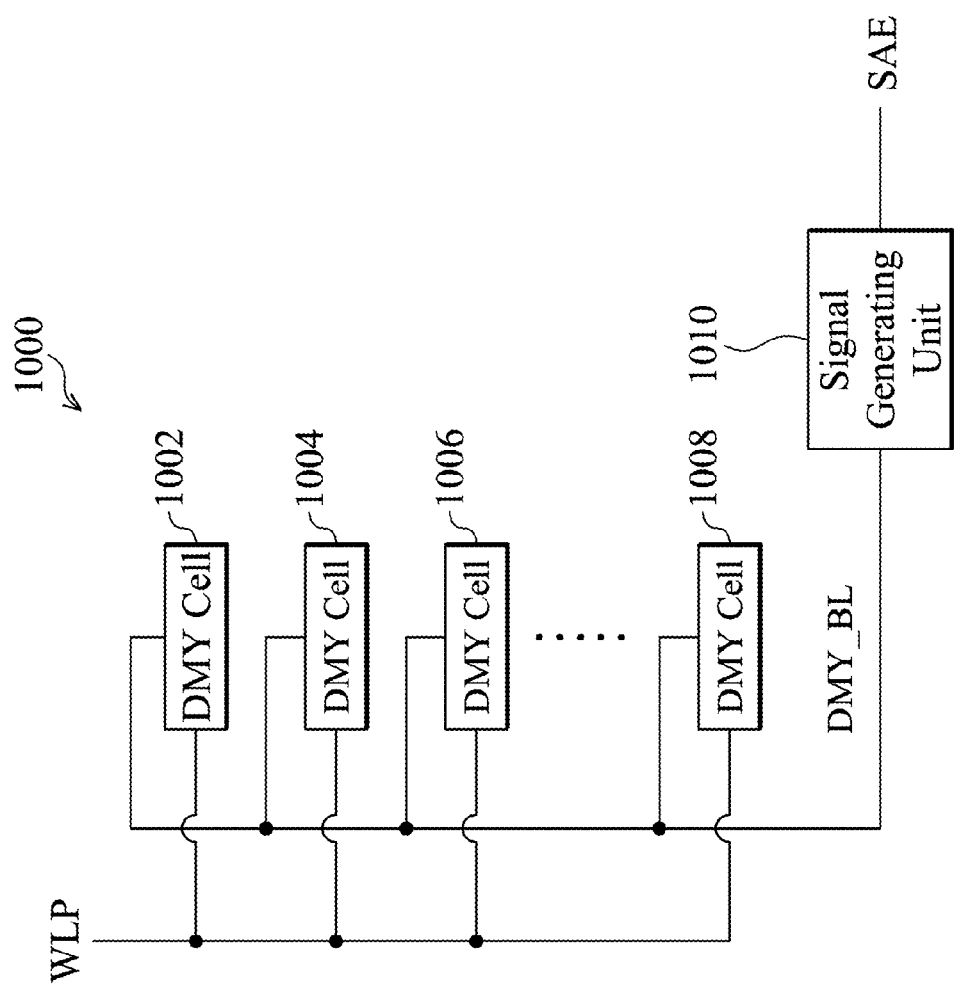
FIG. 10 is a block diagram of another embodiment of a tracking circuit according to the invention

Referring to FIG. 10, a block diagram of another embodiment of a tracking circuit 1000 according to the invention is shown. The tracking circuit 1000 comprises a plurality of dummy cells 1002~1008, a dummy bit line DMY_BL, and a signal generating unit 1010. The dummy cells 1002~1008 are controlled by a word line pulse WLP. When the word line pulse signal WLP is enabled, the dummy cells 1002~1008 may lower a dummy bit line signal on the dummy bit line DMY_BL. The dummy bit line DMY_BL carries the dummy bit line signal. In one embodiment, the dummy bit line signal is a voltage on the dummy bit line DMY_BL. The signal generating unit 1010 then generates the sense amplifier enable signal SAE according to the dummy bit line signal. In one embodiment, the signal generating unit 1010 is an inverter which inverts the voltage of the dummy bit line DMY_BL to obtain a sense amplifier enable signal SAE for enabling a sense amplifier. In another embodiment, the signal generating unit 1010 is a buffer which buffers the dummy bit line signal to obtain the sense amplifier enable signal SAE. In another embodiment, the signal generating unit 1010 is a Schmitt trigger. The Schmitt trigger outputs a high level signal as the sense amplifier enable signal SAE when the dummy bit line signal is higher than a high threshold, outputs a low level signal as the sense amplifier enable signal SAE when the dummy bit line signal is lower than a low threshold, and retains the original level of the sense amplifier enable signal SAE when the dummy bit line signal is lower than the high threshold and higher than the low threshold. Because the dummy cells 1002~1008 may gradually lower the voltage of the dummy bit line DMY_BL, the voltage of the dummy bit line DMY_BL is lowered with a delay, and the sense amplifier enable signal SAE is enabled with a delay in comparison with the word line pulse signal WLP.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A tracking circuit of a memory circuit, coupled between a control circuit and a sense amplifier, delaying a word-line pulse signal generated by the control circuit by a delay period to generate a sense amplifier enable signal enabling the sense amplifier to detect a data bit output by a memory cell array, comprising:

a plurality of dummy cells, at least one of the plurality of dummy cells comprising a plurality of cascaded transistors cascaded between a dummy bit line and a ground voltage for lowering a dummy bit line signal on the dummy bit line when the word-line pulse signal is enabled; and the dummy bit line, coupled to the dummy cells, carrying the dummy bit line signal.

2. The tracking circuit as claimed in claim 1, wherein the dummy bit line is coupled between the dummy cells and a signal generating unit, and the tracking circuit further comprises:

the signal generating unit, generating the sense amplifier enable signal according to the dummy bit line signal.

3. The tracking circuit as claimed in claim 2, wherein the signal generating unit is an inverter which inverts the dummy bit line signal to obtain the sense amplifier enable signal.

4. The tracking circuit as claimed in claim 2, wherein the signal generating unit is a buffer which buffers the dummy bit line signal to obtain the sense amplifier enable signal.

5. The tracking circuit as claimed in claim 2, wherein the signal generating unit is a Schmitt trigger which outputs a high level signal as the sense amplifier enable signal when the dummy bit line signal is higher than a high threshold, outputs a low level signal as the sense amplifier enable signal when the dummy bit line signal is lower than a low threshold, and retains the original level of the sense amplifier enable signal when the dummy bit line signal is lower than the high threshold and higher than the low threshold.

6. The tracking circuit as claimed in claim 1, wherein the dummy bit line signal is the voltage on the dummy bit line.

7. The tracking circuit as claimed in claim 1, wherein the memory circuit comprises:

the control circuit, enabling the word-line pulse signal to initiate reading of the memory cell array;

a word-line driver, enabling a word line according to the word-line pulse signal to trigger the memory cell array;

the memory cell array, reading the data bit from a memory cell directed by the enabled word line and outputting the data bit onto a bit line;

the tracking circuit; and the sense amplifier, detecting the data bit on the bit line to generate an output signal when the sense amplifier enable signal is enabled.

8. The tracking circuit as claimed in claim 1, wherein when a voltage level of a voltage source supplied to the memory circuit is decreased, the tracking circuit extends the delay period for delaying the word-line pulse signal to generate the sense amplifier enable signal.

9. The tracking circuit as claimed in claim 1, wherein the at least one of the dummy cells comprises:

a first NMOS transistor, coupled between a first node and the dummy bit line, having a gate controlled by the word-line pulse signal, and coupling the first node to the dummy bit line when the word-line pulse signal is enabled; and the plurality of cascaded transistors, cascaded between the first node and the ground voltage, having gates coupled to a voltage source, and pulling down the voltage of the first node to the ground voltage.

10. The tracking circuit as claimed in claim 9, wherein the cascaded transistors comprises:

a second NMOS transistor, coupled between the first node and a second node, having a gate coupled to the voltage source; and a third NMOS transistor, coupled between the second node and the ground voltage, having a gate coupled to the voltage source.

11. The tracking circuit as claimed in claim 9, wherein the cascaded transistors comprises:

a second NMOS transistor, coupled between the first node and a second node, having a gate coupled to the voltage source;

a third NMOS transistor, coupled between the second node and a third node, having a gate coupled to the voltage source; and a fourth NMOS transistor, coupled between the third node and the ground voltage, having a gate coupled to the voltage source.

12. The tracking circuit as claimed in claim 1, wherein the at least one of the dummy cells comprises:

a first NMOS transistor, coupled between a first node and the dummy bit line, having a gate controlled by the word-line pulse signal, and coupling the first node to the dummy bit line when the word-line pulse signal is enabled; and the plurality of cascaded transistors, cascaded between the first node and the ground voltage, having gates coupled to drains thereof, and pulling down the voltage of the first node to the ground voltage.

13. The tracking circuit as claimed in claim 12, wherein the cascaded transistors comprises:

a second NMOS transistor, coupled between the first node and a second node, having a gate coupled to the first node; and a third NMOS transistor, coupled between the second node and the ground voltage, having a gate coupled to the second node.

14. The tracking circuit as claimed in claim 12, wherein threshold voltages of the cascaded transistors are not greater than threshold voltages of transistors forming memory cells of the memory cell array.

15. A memory circuit, comprising:

a control circuit, enabling a word-line pulse signal to initiate reading of a memory cell array;

a word-line driver, enabling a word line according to the word-line pulse signal to trigger the memory cell array;

the memory cell array, reading a data bit from a memory cell directed by the enabled word line and outputting the data bit onto a bit line;

a tracking circuit, delaying the word-line pulse signal by a delay period to generate a sense amplifier enable signal; and a sense amplifier, detecting the data bit on the bit line to generate an output signal when the sense amplifier enable signal is enabled, wherein the tracking circuit comprises a plurality of dummy cells and a dummy bit line coupled to the dummy cells, the dummy bit line carrying a dummy bit line signal, at least one of the dummy cells comprises a plurality of cascaded transistors cascaded between the dummy bit line and a ground voltage for lowering the dummy bit line signal on the dummy bit line when the word-line pulse signal is enabled.

16. The memory circuit as claimed in claim 15, wherein the dummy bit line is coupled between the dummy cells and a signal generating unit, and the tracking circuit further comprises the signal generating unit generating the sense amplifier enable signal according to the dummy bit line signal.

17. The memory circuit as claimed in claim 16, wherein the signal generating unit is an inverter which inverts the dummy bit line signal to obtain the sense amplifier enable signal.

18. The memory circuit as claimed in claim 16, wherein the signal generating unit is a buffer which buffers the dummy bit line signal to obtain the sense amplifier enable signal.

19. The memory circuit as claimed in claim 16, wherein the signal generating unit is a Schmitt trigger which outputs a high level signal as the sense amplifier enable signal when the dummy bit line signal is higher than a high threshold, outputs a low level signal as the sense amplifier enable signal when the dummy bit line signal is lower than a low threshold, and retains the original level of the sense amplifier enable signal when the dummy bit line signal is lower than the high threshold and higher than the low threshold.

20. The memory circuit as claimed in claim 15, wherein when a voltage level of a voltage source supplied to the memory circuit is decreased, the tracking circuit extends the delay period for delaying the word-line pulse signal to generate the sense amplifier enable signal.

21. The memory circuit as claimed in claim 15, wherein threshold voltages of the cascaded transistors are not greater than threshold voltages of transistors forming memory cells of the memory cell array.

* * * * *